United States Patent
Wright et al.

(10) Patent No.: US 9,972,425 B2
(45) Date of Patent: May 15, 2018

(54) FREQUENCY-DEPENDENT RESISTOR AND CIRCUITRY EMPLOYING THE SAME

(71) Applicant: RF Micro Devices, Inc., Greensboro, NC (US)

(72) Inventors: Peter V. Wright, Portland, OR (US); Kerry Burger, Summerfield, NC (US)

(73) Assignee: Qorvo US, Inc., Greensboro, NC (US)

( * ) Notice: Subject to any disclaimer, the term of this patent is extended or adjusted under 35 U.S.C. 154(b) by 78 days.

(21) Appl. No.: 14/946,028

(22) Filed: Nov. 19, 2015

(65) Prior Publication Data

US 2017/0004909 A1     Jan. 5, 2017

Related U.S. Application Data

(60) Provisional application No. 62/186,775, filed on Jun. 30, 2015.

(51) Int. Cl.
*H03H 11/04*     (2006.01)
*H01C 7/00*     (2006.01)
(Continued)

(52) U.S. Cl.
CPC ............ *H01C 7/006* (2013.01); *H03H 7/465* (2013.01); *H03K 17/04123* (2013.01);
(Continued)

(58) Field of Classification Search
CPC . H01C 1/01; H01C 7/00; H01C 7/006; H01C 13/00; H01H 11/00; H01P 1/10; H01P 1/15; H01P 5/18; H03H 7/00; H03H 7/01; H03H 11/04; H03K 17/04; H03K 17/16; H03K 17/162; H04B 1/04; H04B 1/16; H04B 1/18; H04B 1/28; H04B 1/40; H04B 1/0475; H04B 3/36; H04B 15/00; H04N 21/61; H04N 21/472

USPC ....... 29/622; 331/96; 333/12, 101, 103, 105, 333/116, 172; 375/211, 296; 455/78, 84, 455/188.1, 319

See application file for complete search history.

(56) References Cited

U.S. PATENT DOCUMENTS

| 2003/0107465 A1* | 6/2003 | Hiraoka ............... H01C 7/00 338/13 |
| 2010/0245030 A1* | 9/2010 | Ikeda .................. G01J 5/02 338/307 |
| 2013/0113575 A1* | 5/2013 | Easter ................. H01P 1/15 333/103 |

OTHER PUBLICATIONS

M. Rezaei, "A New Frequency Dependent Resistor for Modeling Skin Effect of Wire and Echo Cancellation by PSO", Apr. 2010, IEEE.*

* cited by examiner

*Primary Examiner* — Shawkat M Ali
(74) *Attorney, Agent, or Firm* — Withrow & Terranova, P.L.L.C.

(57) ABSTRACT

A frequency-dependent resistor and circuitry employing the same are provided. In some embodiments, a resistor includes a substrate, an input port, an output port, and a conductive trace on the substrate between the input port and the output port. A resistance between the input port and the output port for a low frequency signal is at least five times lower than the resistance between the input port and the output port for an RF signal and the ratio of the frequencies of the RF signal to the low frequency signal is at least fifty. Circuitry including a transistor adapted to selectively couple the input to the output in response to a control signal provided via a resistor with resistance for a low frequency signal at least five times lower than resistance for an RF signal will have a reduced switching time while still isolating the RF signal.

20 Claims, 5 Drawing Sheets

(51) Int. Cl.
*H04B 1/04* (2006.01)
*H03H 7/46* (2006.01)
*H03K 17/0412* (2006.01)
*H03K 17/10* (2006.01)
*H01C 1/01* (2006.01)
*H03H 7/52* (2006.01)

(52) U.S. Cl.
CPC ......... *H03K 17/102* (2013.01); *H04B 1/0475* (2013.01); *H01C 1/01* (2013.01); *H03H 7/52* (2013.01)

FREQUENCY-DEPENDENT RESISTOR AND CIRCUITRY EMPLOYING THE SAME

RELATED APPLICATIONS

This application claims the benefit of provisional patent application Ser. No. 62/186,775, filed Jun. 30, 2015, the disclosure of which is hereby incorporated herein by reference in its entirety.

FIELD OF THE DISCLOSURE

The present disclosure relates to a resistor, and more particularly to a resistor used for a Radio Frequency (RF) switch.

BACKGROUND

Radio Frequency (RF) multi-throw switches are critical components in today's mobile devices. They are used to connect a common port of the switch to one of two or more selectable output/input ports. The connection path must exhibit very low loss so as not to degrade system efficiency, while at the same time, the two connected ports must have high isolation from the remaining ports. At the antenna of an RF front-end, for example, the high isolation is very important for protecting the sensitive receiver input from high RF transmit power.

Semiconductor Field-Effect Transistors (FETs) on materials such as GaAs, Silicon-On-Insulator (SOI), etc. are widely used for implementing RF switches. However, in order to achieve the high levels of isolation required, multiple devices must be stacked in series in the through and shunt paths. To change the state of these switches, a Direct Current (DC) control voltage must be selectively applied to the gates of the appropriate FETs. To prevent RF energy from being lost into the control circuit, the control voltages are typically applied through a network of resistors. These resistors impede the flow of the RF energy into the control circuit. To achieve the very low insertion losses required, these resistors are typically tens or hundreds of kilohms (kΩ) in value. While the isolated FETs could be switched from conducting to isolated states extremely rapidly, an RF switch implemented in the manner described exhibits relatively long switching times. This is attributable to the high value of the resistors, through which the control voltage is applied, which, along with internal capacitances inherent in the FET switches, lead to very large RC time constants for the device.

Accordingly, resistors and switches are needed for reducing the switching time of RF switches while maintaining high isolation.

SUMMARY

A frequency-dependent resistor and circuitry employing the same are provided. In some embodiments, a resistor includes a substrate, an input port, an output port, and a conductive trace on the substrate between the input port and the output port. A resistance between the input port and the output port for a low frequency signal is at least five times lower than the resistance between the input port and the output port for an RF signal, and the ratio of the frequencies of the RF signal to the low frequency signal is at least fifty.

In some embodiments, circuitry includes at least one transistor with an input coupled to a source of the at least one transistor and an output coupled to a drain of the at least one transistor. The at least one transistor is adapted to selectively couple the input to the output in response to a control signal provided via at least one resistor. The at least one resistor has resistance for a low frequency signal at least five times lower than the resistance for an RF signal. This circuitry will have a reduced switching time while still isolating the RF signal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

A Radio Frequency (RF) switch with reduced switching time using skin-effect resistors is provided. In some embodiments, a resistor includes a substrate, an input port, an output port, and a conductive trace on the substrate between the input port and the output port. A resistance between the input port and the output port for a low frequency signal is at least five times lower than the resistance between the input port and the output port for an RF signal.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
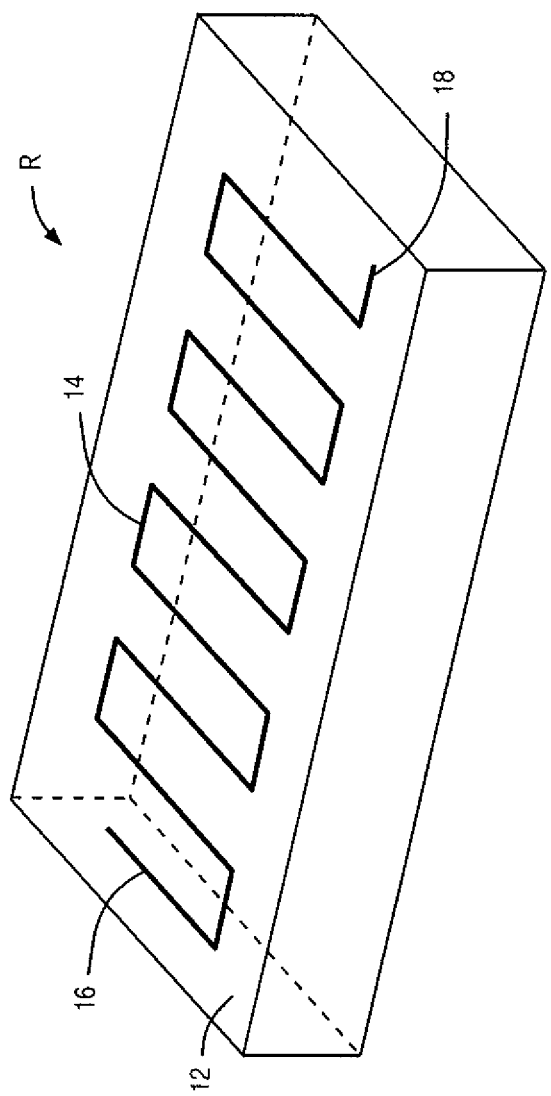
FIG. 1 shows a resistor, according to some embodiments of the current disclosure.

FIG. 1 shows a resistor R, according to some embodiments of the current disclosure. In this embodiment, resistor R includes a substrate 12 with a conductive trace 14 on the substrate 12. Resistor R also includes an input port 16 and an output port 18 at the ends of the conductive trace 14. In this example, the conductive trace 14 is shown as a meander line between the input port 16 and the output port 18. This is merely one example configuration; however, the present disclosure is not limited thereto. In some embodiments, the conductive trace 14 is a thin film. When any electrical signal is presented at the input port 16, that electrical signal will experience a resistance as it travels through the conductive trace 14 to the output port 18. Specifically, resistor R has a resistance between the input port 16 and the output port 18 for a low frequency signal that is at least five times lower than the resistance between the input port 16 and the output port 18 for a radio frequency (RF) signal. As discussed herein, a high frequency signal has a frequency that is at least fifty times the frequency of a low frequency signal. For example, a low frequency signal is at or below 10 megahertz (MHz) while an RF signal is at or above 1 gigahertz (GHz).

This difference in the resistivity of the resistor R is due to the use of materials that exhibit a frequency-dependent resistance. According to some embodiments, this is achieved by using a material with both high resistivity and a high magnetic permeability. Magnetic permeability ($\mu$) is measured in Henries/meter (H/m). For instance, the magnetic permeability of a vacuum is $4\pi \times 10^{-7}$ H/m and is referred to as $\mu_0$. The relative magnetic permeability of a substance is given by its magnetic permeability divided by $\mu_0$. In some embodiments, the conductive trace 14 has a relative magnetic permeability of at least 100, meaning that its magnetic permeability is at least 100 times larger than that of a vacuum. In other embodiments, the conductive trace has a relative magnetic permeability of at least 1000. In some embodiments, the conductive trace 14 includes at least one of Iron, Cobalt, Nickel, or a combination of one of these.

A high relative magnetic permeability leads to an increase in the Skin-Effect. This usually undesirable effect is caused due to the rapidly fluctuating magnetic field in the conductive trace 14 when an alternating current (AC) signal is applied. The higher the frequency of the signal, the more rapidly the magnetic field changes. This causes charge carriers to be limited to the skin of the conductive trace 14. The higher the frequency of the signal, the shallower the skin depth of the charge carriers becomes in the conductive trace 14. The shallower skin depth creates a reduced cross-sectional area of the conductive trace 14 that is available for charge carriers. This leads to a higher resistance of the conductive trace 14.

Figure 2:
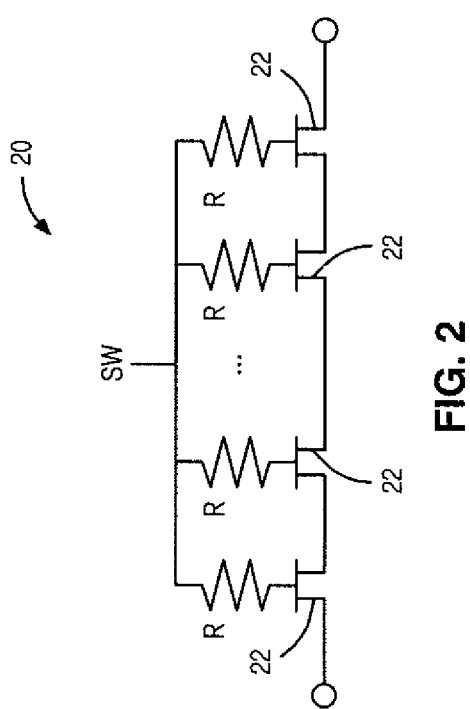
FIG. 2 shows a Radio Frequency (RF) switch using the resistor of FIG. 1, according to some embodiments of the current disclosure.

In one embodiment of the resistor R, the resistance between the input port 16 and the output port 18 for a signal at or below 10 MHz is at most 10 kilohms (k$\Omega$), and the resistance between the input port and the output port for a signal at or above 1 GHz is at least 100 k$\Omega$. FIG. 2 shows an RF switch 20 using the resistor R of FIG. 1, according to some embodiments of the current disclosure. In this example, semiconductor Field-Effect Transistors (FETs) 22 are used for implementing RF switch 20. Although four FETs 22 are shown in this figure, this is merely for illustrative purposes, and the current disclosure is not limited thereto. In order to achieve the high levels of isolation often required for an RF switch 20, multiple FETs 22 are stacked in series. To change the state of these multiple FETs 22, a Direct Current (DC) control voltage SW must be selectively applied to the gates of the appropriate FETs 22. To prevent RF energy from being lost into the control circuit, the control voltages are typically applied through a network of resistors R. To achieve the very low insertion losses required, these resistors are typically tens or hundreds of kilohms (k$\Omega$) in value. By using one or more resistors R as described above in relation to FIG. 1, high isolation is provided since the RF signal will encounter a relatively high resistance. However, the control voltage SW used to switch the state of the one or more FETs 22 will encounter a relatively low resistance from the one or more resistors R. Thus, even while providing a similar amount of isolation, the RF switch 20 will have a reduced RC time constant for switching the device. This results in an RF switch 20 with reduced switching time. While this RF switch 20 includes FETs 22 and multiple resistors R, an RF switch can be formed in other ways that would still benefit from the use of resistor R.

Figure 3:
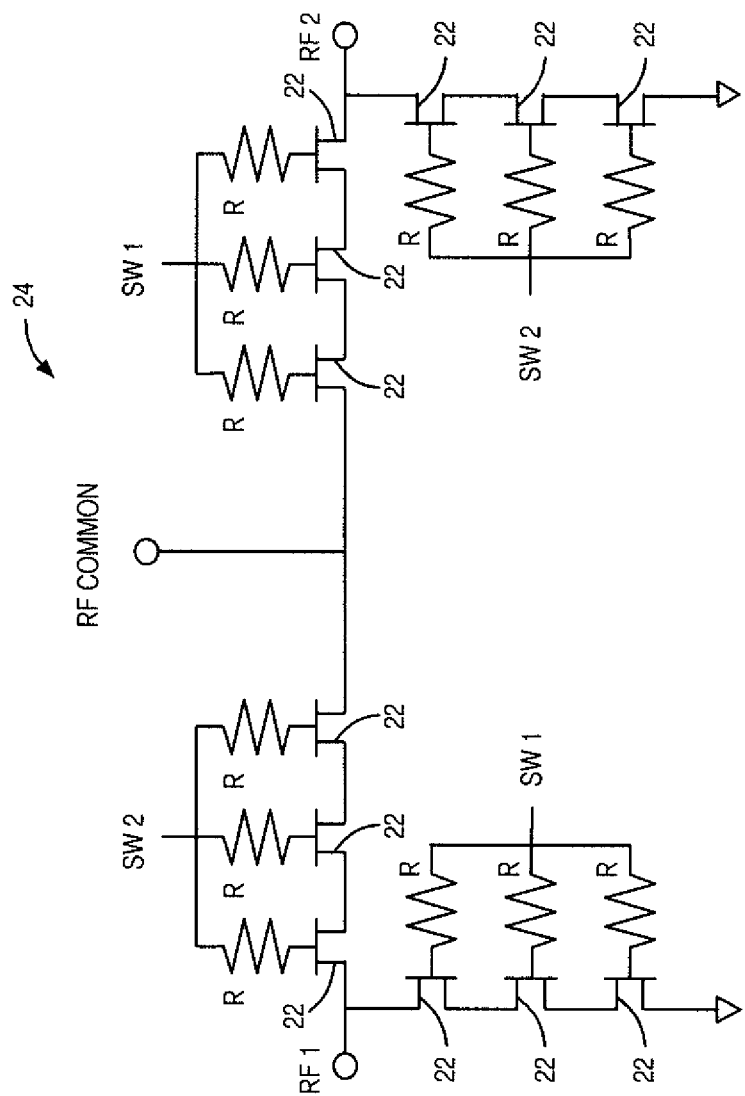
FIG. 3 shows another RF switch using the resistor of FIG. 1, according to some embodiments of the current disclosure.

FIG. 3 shows another RF switch 24 using the resistor R of FIG. 1, according to some embodiments of the current disclosure. This RF switch 24 includes an RF common port which can alternately be connected to either an RF1 port or an RF2 port. In this example, four switches similar to the one described in relation to FIG. 2 allow for the switching between the RF1 port and the RF2 port. Specifically, when a control voltage SW1 is applied, the RF common port is connected to the RF2 port through a series of FETs 22. The same control voltage SW1 also connects the RF1 port to ground through a shunt also including a series of FETs 22. Alternatively, when a control voltage SW2 is applied, the RF common port is connected to the RF1 port through a series of FETs 22. The same control voltage SW2 also connects the RF2 port to ground through a shunt also including a series of FETs 22.

By applying the control voltages SW1 and SW2 through the resistors R which have resistance for a low frequency signal at least five times lower than the resistance for an RF signal, the RF switch 24 has a reduced switching time for the same level of RF isolation. This is because the control voltages SW1 and SW2 are DC signals, which have a frequency of zero. In practice, when the RF switch 24 is being switched from the RF1 port to the RF2 port rapidly, the control signals SW1 and SW2 essentially behave as low frequency signals. Since the resistance exerted on these control signals by the one or more resistors R is lower for a low frequency signal, the RC time constant for switching is reduced. However, the resistance exerted on the RF signals as they attempt to leak out into the control circuits is at least at least five times higher. This provides increased isolation of the RF signals and reduces the amount of energy lost into the control circuits. In some embodiments, an RC time constant of the at least one FET 22 and the at least one resistor R is less than or equal to 10 microseconds ($\mu$s) while still providing a high level of isolation.

Figure 4:
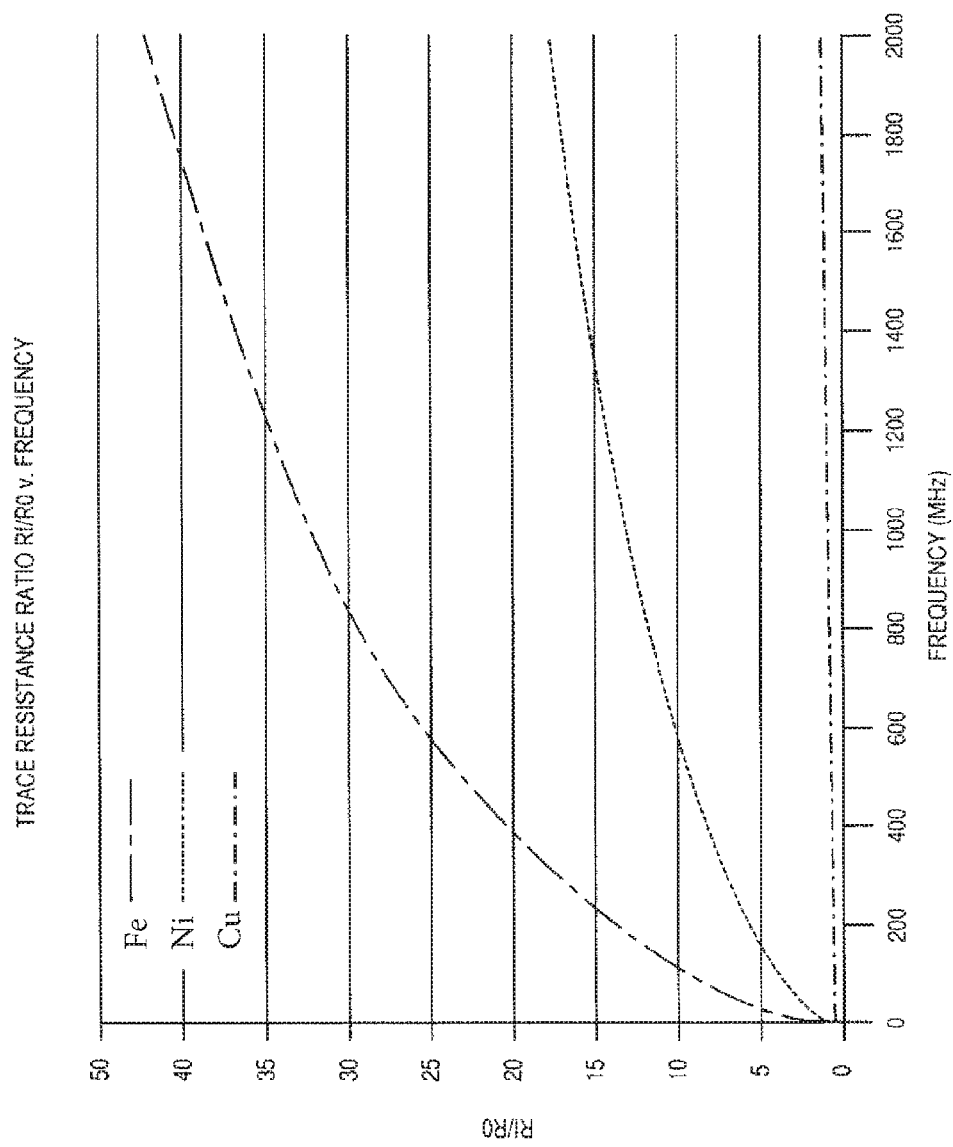
FIG. 4 shows the relationship between the trace resistance ratio of a material and the frequency of a signal.

The previous embodiments can be implemented with any resistor wherein a resistance between the input port and the output port for a low frequency signal is at least five times lower than the resistance between the input port and the output port for a RF signal. As discussed above, one way of accomplishing this is to use a resistor with a conductive trace that has a high relative magnetic permeability. FIG. 4 shows the relationship between the trace resistance ratio of a material and the frequency of a signal. Copper (Cu) has a relatively low magnetic permeability $\mu$. According to some tables, Cu has a relative magnetic permeability of $1.256629 \times 10^{-6}$ H/m or a relative magnetic permeability of 0.999994. This leads to almost no frequency dependence in the resistivity of Cu. In most circuits, this is a desirable property since the resistance of a component is often used to calculate other parameters. If the frequency of signals received during operation may change or be unknown, it will be difficult or impossible to plan accordingly. This near frequency independence of Cu is shown in FIG. 4 where the trace resistance ratio ($R_f/R_0$) remains essentially constant as the frequency of the signal is increased from zero Hz to 2 GHz.

In contrast, the magnetic permeability of Nickel (Ni) is between $1.26 \times 10^{-4}$-$7.54 \times 10^{-4}$ H/m or a relative magnetic permeability of approximately 100-600. As such, the plot of the trace resistance ratio of Ni in FIG. 4 shows a large increase as the frequency increases. Similarly, the magnetic permeability of Iron (Fe) is between $6.3 \times 10^{-3}$ H/m (99.8% pure) and $2.5 \times 10^{-1}$ H/m (99.95% pure) or a relative magnetic permeability of approximately 5000-200000. As such, the plot of the trace resistance ratio of Fe in FIG. 4 shows an even larger increase than Ni as the frequency increases.

By using a material with a high magnetic permeability to create a resistor, the resistor may have a resistance between the input port and the output port for a low frequency signal that is at least five times lower than the resistance between the input port and the output port for an RF signal. By using a resistor with this frequency-dependent resistance, an RF switch can be made with a reduced switching time while maintaining a high isolation. Such a switch can be used in several places in an RF transmitter to increase the performance of the RF transmitter.

Figure 5:
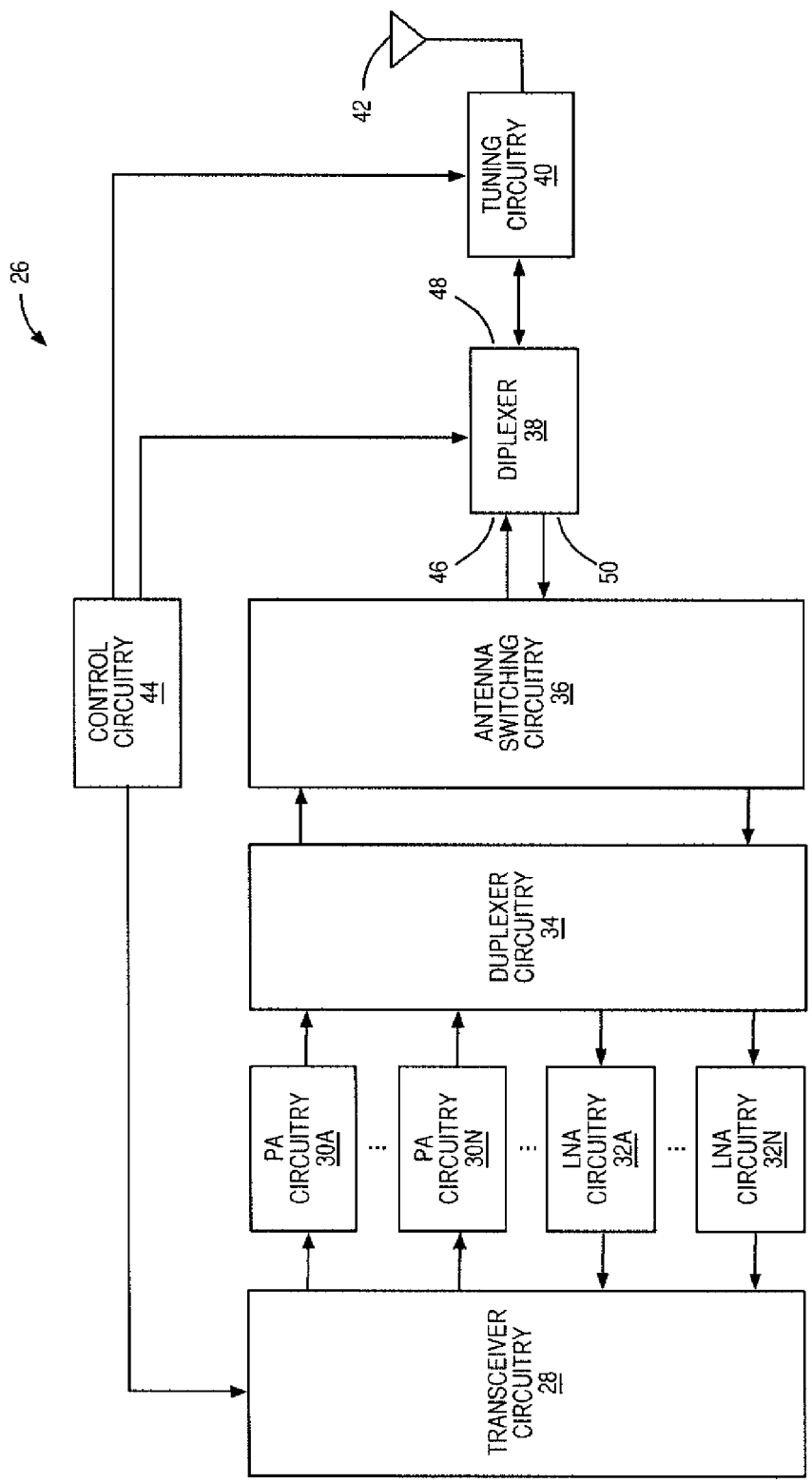
FIG. 5 is a schematic representation of RF front end circuitry according to some embodiments of the present disclosure using one or more of the resistor of FIG. 1, the RF switch of FIG. 2, and the RF switch of FIG. 3.

FIG. 5 shows an exemplary RF front end circuitry 26 using one or more of: the resistor R of FIG. 1, the RF switch 20 of FIG. 2, and the RF switch 24 of FIG. 3. For example, the RF front end circuitry 26 shown in FIG. 5 can function as either an RF transmitter or an RF receiver. When transmitting, transceiver circuitry 28 will modulate a carrier signal. The carrier signal will pass through one or more of a plurality of power amplifiers 30A-30N, where it will be amplified and delivered through duplexer circuitry 34 to antenna switching circuitry 36. The antenna switching circuitry 36 will place one or more output terminals of the plurality of power amplifiers 30A-30N in communication with a low band port 50 of a diplexer 38. As the carrier signal is passed through the diplexer 38, the carrier signal is filtered by a low pass filter. Accordingly, the signal at an antenna port 48 of the diplexer is virtually free of components that fall within the high pass band, thereby preventing signal leakage back from the antenna port 48 to a high band port 46 of the diplexer 38. By preventing signal leakage from the antenna port 48 to the high band port 46 during transmission of a signal, desensitization of the receive circuitry is avoided, and the signal passed to an antenna 42 through antenna tuning circuitry 40 is virtually free of harmonic distortion as a result of the antenna switching circuitry 36. The RF front end circuitry 26 is controlled by control circuitry 44.

When receiving, the RF front end circuitry 26 performs a similar process but in reverse. Although, where the transmitted signal passed through one or more of the plurality of power amplifiers 30A-30N, where it was amplified and delivered through the duplexer circuitry 34 to the antenna switching circuitry 36, the received signal is delivered through the duplexer circuitry 34 to pass through one or more of a plurality of low-noise amplifiers 32A-32N.

A resistor R of FIG. 1, an RF switch 20 of FIG. 2, and/or an RF switch 24 of FIG. 3 can be used in one or more components of RF front end circuitry 26. For instance, one of these components can be used in duplexer circuitry 34, the antenna switching circuitry 36, the diplexer 38, and/or the antenna tuning circuitry 40 in some embodiments.

Those skilled in the art will recognize improvements and modifications to the preferred embodiments of the present disclosure. All such improvements and modifications are considered within the scope of the concepts disclosed herein and the claims that follow.

What is claimed is:

1. A resistor comprising:
   a substrate;
   an input port;
   an output port; and
   a conductive trace on the substrate between the input port and the output port;
   wherein a resistance between the input port and the output port for a low frequency signal is at least five times lower than the resistance between the input port and the output port for a radio frequency (RF) signal and a ratio of a frequency of the RF signal to the low frequency signal is at least fifty.

2. The resistor of claim 1, wherein the resistance between the input port and the output port for a signal at or below 10 Megahertz (MHz) is at most 10 kilohms (kΩ), and the resistance between the input port and the output port for a signal at or above 1 gigahertz (GHz) is at least 100 kΩ.

3. The resistor of claim 1, wherein the conductive trace has a relative magnetic permeability of at least 100.

4. The resistor of claim 3, wherein the conductive trace has a relative magnetic permeability of at least 1000.

5. The resistor of claim 1, wherein the conductive trace comprises one of Iron, Cobalt, and Nickel.

6. The resistor of claim 5, wherein the conductive trace comprises Cobalt.

7. The resistor of claim 1, wherein the conductive trace is a thin film.

8. The resistor of claim 1, wherein the conductive trace is a meander line on the substrate.

9. Circuitry comprising:
   at least one transistor with an input coupled to a source of the at least one transistor and an output coupled to a drain of the at least one transistor;
   wherein the at least one transistor is adapted to selectively couple the input to the output in response to a control signal provided via at least one resistor and the at least one resistor has a resistance for a low frequency signal at least five times lower than the resistance for a Radio Frequency (RF) signal and a ratio of a frequency of the RF signal to the low frequency signal is at least fifty.

10. The circuitry of claim 9, wherein the input of the at least one transistor is connected to an incoming RF port and the output of the at least one transistor is connected to an outgoing RF port; and the circuitry further comprises:
   at least one second transistor with an input coupled to a source of the at least one second transistor and an output coupled to a drain of the at least one second resistor wherein:
      the at least one second transistor is adapted to selectively couple the input to the output in response to a second control signal provided via at least one second resistor and the at least one second resistor has a resistance for the low frequency signal at least five times lower than the resistance for the RF signal;
      the input of the at least one second transistor is connected to the incoming RF port; and
      the output of the at least one second transistor is connected to a ground.

11. The circuitry of claim 9, wherein a resistance-capacitance (RC) time constant of the at least one transistor and the at least one resistor is less than or equal to 10 microseconds (µs).

12. The circuitry of claim 9, wherein the at least one resistor has the resistance for a signal at or below 10 megahertz (MHz) that is at most one-tenth the resistance for a signal at or above 1 gigahertz (GHz).

13. The circuitry of claim 12, wherein the at least one resistor has the resistance for a signal at or below 10 MHz that is at most 10 kilohms (kΩ) and the resistance for a signal at or above 1 GHz is at least 100 kΩ.

14. The circuitry of claim 9, wherein the at least one resistor comprises one of Iron, Cobalt, and Nickel.

15. The circuitry of claim 14, wherein the at least one resistor comprises Cobalt.

16. The circuitry of claim 9, wherein the at least one resistor comprises a thin film.

17. A radio frequency (RF) transmitter comprising:
modulator circuitry configured to receive a baseband signal and provide an RF input signal;
an amplifier configured to receive and amplify the RF input signal to provide an RF output signal; and
front end circuitry configured to receive the RF output signal and provide the RF output signal to an antenna for transmission comprising at least one RF circuitry;
wherein the at least one RF circuitry comprises:
at least one transistor with an input coupled to a source of the at least one transistor and an output coupled to a drain of the at least one transistor;
wherein the at least one transistor is adapted to selectively couple the input to the output in response to a control signal provided via at least one resistor and the at least one resistor has a resistance for a low frequency signal at least five times lower than the resistance between an input port and an output port for an RF signal and a ratio of a frequency of the RF signal to the low frequency signal is at least fifty.

18. The RF transmitter of claim 17, wherein a resistance-capacitance (RC) time constant of the at least one transistor and the at least one resistor in the RF circuitry is less than or equal to 10 microseconds (µs).

19. The RF transmitter of claim 17, wherein the at least one resistor in the RF circuitry comprises one of Iron, Cobalt, and Nickel.

20. The RF transmitter of claim 19, wherein the at least one resistor in the RF circuitry comprises Cobalt.

* * * * *